United States Patent
Kim et al.

(10) Patent No.: US 9,964,618 B2
(45) Date of Patent: May 8, 2018

(54) MAGNETIC RESONANCE IMAGING SYSTEM AND MAGNETIC RESONANCE IMAGING METHOD USING EXCITED SUB-VOLUMES IN GROUPS

(71) Applicant: Samsung Electronics Co., Ltd., Suwon-si (KR)

(72) Inventors: Young Beom Kim, Yongin-si (KR); Yeunchul Ryu, Hwaseong-si (KR); Jong-bum Son, Seongnam-si (KR); Jaemock Yi, Hwaseong-si (KR); Seong-deok Lee, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 856 days.

(21) Appl. No.: 14/059,808

(22) Filed: Oct. 22, 2013

(65) Prior Publication Data

US 2014/0111201 A1    Apr. 24, 2014

(30) Foreign Application Priority Data

Oct. 23, 2012  (KR) .................. 10-2012-0117906
Nov. 14, 2012  (KR) .................. 10-2012-0129106

(51) Int. Cl.
*G01R 33/54*  (2006.01)
*G01R 33/483*  (2006.01)
*G01R 33/561*  (2006.01)

(52) U.S. Cl.
CPC ....... *G01R 33/543* (2013.01); *G01R 33/4835* (2013.01); *G01R 33/5611* (2013.01)

(58) Field of Classification Search
CPC .............. G01R 33/543; G01R 33/4835; G01R 33/5611
See application file for complete search history.

(56) References Cited

U.S. PATENT DOCUMENTS 4,665,367 A * 5/1987 Kramer .............. G01R 33/4835
                                              324/309
6,590,213 B2   7/2003 Wollenweber
(Continued)

FOREIGN PATENT DOCUMENTS

JP    2001-198100 A    7/2001
JP        2004-616 A    1/2004
(Continued)

OTHER PUBLICATIONS

Chinese Office Action dated Feb. 24, 2017 in counterpart Chinese Patent Application No. 201310218888.1 (19 pages, with English translation).

(Continued)

*Primary Examiner* — G. M. Hyder
(74) *Attorney, Agent, or Firm* — NSIP Law

(57) ABSTRACT

A method of magnetic resonance imaging (MRI) includes applying radio frequency (RF) pulses including a plurality of frequency components and a selection gradient to a target to simultaneously excite a plurality of sub-volumes included in each of a plurality of groups, wherein neighboring sub-volumes of all sub-volumes constituting a volume of the target belong to different groups; acquiring magnetic resonance signals from the plurality of sub-volumes by performing 3D encoding on each of the excited sub-volumes; and reconstructing the acquired magnetic resonance signals into image data corresponding to each of the plurality of sub-volumes.

24 Claims, 7 Drawing Sheets

(56) References Cited

U.S. PATENT DOCUMENTS

| | | | |
|---|---|---|---|
| 6,980,001 B2 * | 12/2005 | Paley | G01R 33/445 324/318 |
| 7,002,344 B2 | 2/2006 | Griswold et al. | |
| 7,023,209 B2 | 4/2006 | Zhang et al. | |
| 7,405,405 B2 | 7/2008 | Stearns et al. | |
| 8,022,701 B2 | 9/2011 | Chen et al. | |
| 8,049,496 B2 | 11/2011 | Chen et al. | |
| 8,131,040 B2 | 3/2012 | Koehler et al. | |
| 8,941,381 B2 | 1/2015 | Feinberg et al. | |
| 2001/0009369 A1 * | 7/2001 | Shimo | A61B 5/055 324/307 |
| 2009/0072827 A1 * | 3/2009 | Hargreaves | G01R 33/4822 324/309 |
| 2009/0278538 A1 * | 11/2009 | Chen | G01R 33/446 324/309 |
| 2010/0067758 A1 | 3/2010 | Casey et al. | |
| 2010/0195885 A1 | 8/2010 | Ma | |
| 2011/0254548 A1 | 10/2011 | Setsompop et al. | |
| 2012/0056620 A1 | 3/2012 | Feinberg et al. | |
| 2012/0319686 A1 * | 12/2012 | Jesmanowicz | A61B 5/055 324/309 |
| 2013/0127459 A1 | 5/2013 | Son et al. | |
| 2013/0294670 A1 | 11/2013 | Park et al. | |
| 2014/0056499 A1 | 2/2014 | Park et al. | |
| 2014/0066746 A1 | 3/2014 | Son et al. | |
| 2014/0111201 A1 | 4/2014 | Kim et al. | |
| 2014/0132261 A1 * | 5/2014 | Kim | G01R 33/4835 324/309 |
| 2014/0132264 A1 * | 5/2014 | Kim | G01R 33/4835 324/309 |
| 2014/0203805 A1 * | 7/2014 | Kim | G01R 33/4835 324/309 |
| 2014/0210465 A1 * | 7/2014 | Kim | G01R 33/3635 324/309 |
| 2014/0218033 A1 * | 8/2014 | Ryu | G01R 33/34046 324/319 |

FOREIGN PATENT DOCUMENTS

| | | |
|---|---|---|
| JP | 2004-358221 A | 12/2004 |
| JP | 2006-175223 A | 7/2006 |
| KR | 10-2008-0110316 A | 12/2008 |
| KR | 10-2009-0014982 A | 2/2009 |
| KR | 10-2010-0081005 A | 7/2010 |
| WO | WO 2011/106649 A1 | 9/2011 |

OTHER PUBLICATIONS

Japanese Office Action dated Aug. 29, 2017 in counterpart Japanese Patent Application No. 2013-219553 (7 pages, in Japanese with English translation).

Extended European Search Report dated Jan. 8, 2018 in counterpart European Patent Application No. 13189730.8 (7 pages, in English).

* cited by examiner

MAGNETIC RESONANCE IMAGING SYSTEM AND MAGNETIC RESONANCE IMAGING METHOD USING EXCITED SUB-VOLUMES IN GROUPS

CROSS-REFERENCE TO RELATED APPLICATIONS

This application claims the benefit under 35 U.S.C. § 119(a) of Korean Patent Application Nos. 10-2012-0117906 filed on Oct. 23, 2012, and 10-2012-0129106 filed on Nov. 14, 2012, in the Korean Intellectual Property Office, the disclosures of which are both incorporated herein by reference in their entirety for all purposes.

BACKGROUND

1. Field

The present disclosure relates to methods and apparatuses for magnetic resonance imaging.

2. Description of Related Art

A magnetic resonance imaging (MRI) system is able to create an image of biological tissue, such as a human body, using a magnetic field generated by a magnetic force. The MRI system applies a high frequency signal to the biological tissue to generate a resonance phenomenon from the biological tissue. In addition, the MRI system applies a gradient to the biological tissue to obtain space information about the biological tissue.

SUMMARY

In one general aspect, a method of magnetic resonance imaging (MRI) includes applying radio frequency (RF) pulses including a plurality of frequency components and a selection gradient to a target to simultaneously excite a plurality of sub-volumes included in each of a plurality of groups, wherein neighboring sub-volumes of all sub-volumes constituting a volume of the target belong to different groups; acquiring magnetic resonance signals from the plurality of sub-volumes by performing 3D encoding on each of the excited sub-volumes; and reconstructing the acquired magnetic resonance signals into image data corresponding to each of the plurality of sub-volumes.

The plurality of groups may include a first group through an N-th group, where N is a natural number that is equal to or greater than two, and the MRI method may further include sequentially and iteratively assigning the plurality of sub-volumes into one of the first to N-th groups.

The acquiring of the magnetic resonance signals from the plurality of sub-volumes by performing 3D encoding on each of the excited sub-volumes may include applying a first encoding gradient with respect to a first direction and a second encoding gradient with respect to a second direction to each of the excited sub-volumes, where either the first direction or the second direction may be the same as a direction in which the selection gradient is applied.

The MRI method may further include applying a read-out gradient to the target to read out magnetic resonance signals from the plurality of sub-volumes, and the acquiring of the magnetic resonance signals from the plurality of sub-volumes may include acquiring the read-out magnetic resonance signals from the plurality of sub-volumes using multi-channel receiving coils.

The reconstructing of the acquired magnetic resonance signals into the image data corresponding to each of the plurality of sub-volumes may include using a parallel imaging algorithm to reconstruct the acquired magnetic resonance signals into the image data corresponding to each of the plurality of sub-volumes taking into consideration channel information of multi-channel receiving coils.

The applying of the RF pulses including a plurality of frequency components may include applying RF pulses each having a different phase.

The reconstructing of the acquired magnetic resonance signals into the image data corresponding to each of the plurality of sub-volumes may include using a parallel imaging algorithm to reconstruct the acquired magnetic resonance signals into the image data corresponding to each of the plurality of sub-volumes taking into consideration channel information of multi-channel receiving coils and a phase of each of the RF pulses.

The MRI method may further include combining the image data corresponding to each of the plurality of sub-volumes included in each of the plurality of groups.

The MRI method may further include synthesizing the image data corresponding to each of the plurality of sub-volumes to generate a 3D volume image.

In another general aspect, a method of magnetic resonance imaging (MRI) includes reconstructing image data corresponding to each of a plurality of sub-volumes included in any one of a plurality of groups by applying a predetermined pulse sequence to a target, wherein neighboring sub-volumes of all sub-volumes constituting a volume of the target belong to different groups; repeating the reconstructing of the image data for each group until the reconstructing of the image data has been performed for all groups constituting the volume of the target; and generating a 3D volume image by combining the image data corresponding to each of the plurality of sub-volumes included in each of the groups constituting the volume of the target after the reconstructing of the image data has been performed for all groups constituting the volume of the target.

The plurality of groups may include a first group through an N-th group, where N is a natural number that is equal to or greater than two, and the MRI method may further include sequentially and iteratively assigning the plurality of sub-volumes to one of the first to N-th groups.

In another general aspect, a non-transitory computer-readable storage medium has stored thereon a program including instructions that when executed cause a processor to apply radio frequency (RF) pulses including a plurality of frequency components and a selection gradient to a target to simultaneously excite a plurality of sub-volumes included in each of a plurality of groups, wherein neighboring sub-volumes of all sub-volumes constituting a volume of the target belong to different groups; acquire magnetic resonance signals from the plurality of sub-volumes by performing 3D encoding on each of the excited sub-volumes; and reconstruct the acquired magnetic resonance signals into image data corresponding to each of the plurality of sub-volumes.

In another general aspect, a non-transitory computer-readable storage medium has stored thereon a program including instructions that when executed cause a processor to reconstruct image data corresponding to each of a plurality of sub-volumes included in any one of a plurality of groups by applying a predetermined pulse sequence to a target, wherein neighboring sub-volumes of all sub-volumes constituting a volume of the target belong to different groups; repeat the reconstructing of the image data for each group until the reconstructing of the image data has been performed for all groups constituting the volume of the target; and generate a 3D volume image by combining the image data corresponding to each of the plurality of sub-volumes included in each of the groups constituting the volume of the target after the reconstructing of the image data has been performed for all groups constituting the volume of the target.

In another general aspect, a magnetic resonance imaging (MRI) system includes an MRI scanning apparatus configured to apply radio frequency (RF) pulses including a plurality of frequency components and a selection gradient to a target to simultaneously excite a plurality of sub-volumes included in each of a plurality of groups, wherein neighboring sub-volumes of all sub-volumes constituting a volume of the target belong to different groups and acquire magnetic resonance signals from the plurality of sub-volumes by performing 3D encoding on each of the excited sub-volumes; and a data processing apparatus configured to reconstruct the acquired magnetic resonance signals into image data corresponding to each of the plurality of sub-volumes.

The plurality of groups may include a first group through an N-th group, where N is a natural number that is equal to or greater than two, and the MRI scanning apparatus may be further configured to sequentially and iteratively assign the plurality of sub-volumes to one of the first to N-th groups.

The MRI scanning apparatus may include gradient coils configured to apply to the target a first encoding gradient with respect to a first direction and a second encoding gradient with respect to a second direction to perform the 3D encoding on each of the excited sub-volumes, where either the first direction or the second direction is the same as a direction in which the selection gradient is applied.

The MRI scanning apparatus may include gradient coils configured to apply a read-out gradient to the target to read out magnetic resonance signals from the plurality of sub-volumes; and RF coils configured to acquire the magnetic resonance signals, and the data processing apparatus may include a reconstruction part configured to reconstruct the magnetic resonance signals acquired from the RF coils into the image data corresponding to each of the plurality of sub-volumes.

The data processing apparatus may be further configured to use a parallel imaging algorithm that takes into consideration channel information of multi-channel receiving coils to reconstruct the acquired magnetic resonance signals into the image data corresponding to each of the plurality of sub-volumes.

The MRI scanning apparatus may include RF coils configured to apply RF pulses each having a different phase to the target.

The data processing apparatus may include a reconstruction part configured to use a parallel imaging algorithm that takes into consideration channel information of multi-channel receiving coils and a phase of each of the RF pulses to reconstruct the acquired magnetic resonance signals into the image data corresponding to each of the plurality of sub-volumes.

The data processing apparatus may include a synthesis part configured to reconstruct the acquired magnetic resonance signals into the image data corresponding to each of the plurality of sub-volumes included in each group, and synthesize the reconstructed image data.

In another general aspect, a method of magnetic resonance imaging (MRI) includes sequentially dividing a target volume into a plurality of sub-volumes along a directional axis; grouping the plurality of sub-volumes into a plurality of groups constituting the target volume, wherein adjacent sub-volumes belong to different groups; applying radio frequency (RF) pulses including a plurality of frequency components and a selection gradient separately to each group to simultaneously excite a plurality of sub-volumes in each group; performing 3D encoding on each of the excited sub-volumes; acquiring magnetic resonance signals from the plurality of 3D encoded sub-volumes; and reconstructing the acquired magnetic resonance signals into image data corresponding to each of the plurality of sub-volumes.

The MRI method may further include synthesizing the image data corresponding to each of the plurality of sub-volumes to generate a 3D volume image.

The performing of the 3D encoding on each of the excited sub-volumes may include applying a first encoding gradient with respect to a first direction and a second encoding gradient with respect to a second direction to each of the excited sub-volumes, where the second direction is the same as the directional axis.

The reconstructing of the acquired magnetic resonance signals into the image data corresponding to each of the plurality of sub-volumes may include using a parallel imaging algorithm to reconstruct the acquired magnetic resonance signals into the image data corresponding to each of the plurality of sub-volumes taking into consideration channel information of multi-channel receiving coils.

The applying of the RF pulses including a plurality of frequency components may include applying RF pulses each having a different phase.

The reconstructing of the acquired magnetic resonance signals into the image data corresponding to each of the plurality of sub-volumes may include using a parallel imaging algorithm to reconstruct the acquired magnetic resonance signals into the image data corresponding to each of the plurality of sub-volumes taking into consideration channel information of multi-channel receiving coils and a phase of each of the RF pulses.

In another general aspect, a magnetic resonance imaging (MRI) system includes an MRI scanning apparatus configured to sequentially divide a target volume into a plurality of sub-volumes along a directional axis; group the plurality of sub-volumes into a plurality of groups constituting the target volume, wherein adjacent sub-volumes belong to different groups; apply radio frequency (RF) pulses including a plurality of frequency components and a selection gradient separately to each group to simultaneously excite a plurality of sub-volumes in a group; perform 3D encoding on each of the excited sub-volumes; and acquire magnetic resonance signals from the plurality of 3D encoded sub-volumes; and an MRI processing apparatus configured to reconstruct the acquired magnetic resonance signals into image data corresponding to each of the plurality of sub-volumes.

The MRI processing apparatus may be further configured to synthesize the image data corresponding to each of the plurality of sub-volumes to generate a 3D volume image.

The MRI scanning apparatus may be further configured to apply a first encoding gradient with respect to a first direction and a second encoding gradient with respect to a second direction to each of the excited sub-volumes, where the second direction is the same as the directional axis.

The MRI processing apparatus may be further configured to use a parallel imaging algorithm taking into consideration channel information of multi-channel receiving coils to reconstruct the acquired magnetic resonance signals into the image data corresponding to each of the plurality of sub-volumes.

The MRI scanning apparatus may be further configured to apply RF pulses each having a different phase.

The MRI processing apparatus may be configured to use a parallel imaging algorithm taking into consideration channel information of multi-channel receiving coils and a phase of each of the RF pulses to reconstruct the acquired magnetic resonance signals into the image data corresponding to each of the plurality of sub-volumes.

Other features and aspects will be apparent from the following detailed description, the drawings, and the claims.

DETAILED DESCRIPTION

Figure 1:
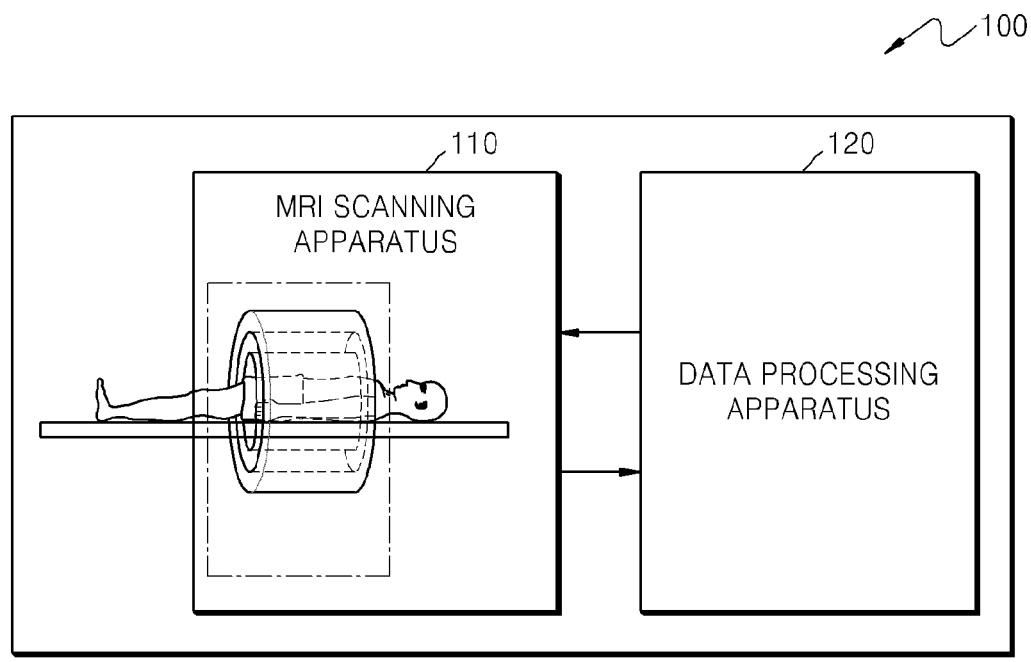
FIG. 1 illustrates an example of a magnetic resonance imaging (MRI) system.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, description of functions and constructions that are well known to one of ordinary skill in the art may be omitted for increased clarity and conciseness.

Throughout the drawings and the detailed description, the same reference numerals refer to the same elements. The drawings may not be to scale, and the relative size, proportions, and depiction of elements in the drawings may be exaggerated for clarity, illustration, and convenience.

FIG. 1 illustrates an example of a magnetic resonance imaging (MRI) system 100. Referring to FIG. 1, the MRI system 100 includes an MRI scanning apparatus 110 and a data processing apparatus 120. The MRI system 100 of FIG. 1 illustrates only constituent elements discussed below with regard to the following example. Thus, it is understood by those of ordinary skill in the art to which the present description pertains that elements other than the constituent elements shown in FIG. 1 also may be included in the MRI system 100. In addition, the MRI system 100 may be a hybrid MRI system. For example, the MRI system 100 may include one or more other medical imaging systems, such as position emission tomography (PET) system.

The MRI system 100 generates an image including information about the biological tissue of a target. For example, the target may include a human body, and parts thereof, such as a brain, a spine, a heart, a liver, an embryo, to name but a few. The image is generated in a non-invasive manner. In one example, the MRI system 100 may generate a diagnostics image of the target using a magnetic field generated by a magnetic force.

The biological tissue of the target forms a volume and may be divided into a plurality of sub-volumes that constitute the volume of the target. The MRI scanning apparatus 110 detects magnetic resonance signals from the plurality of sub-volumes. Each of the sub-volumes may include a predetermined number of slices. In one example, the predetermined number and the thickness of each slice may be determined by a user. In another example, the predetermined number and the thickness of each slice may be automatically determined according to an operating environment or the characteristics of the target.

In one example, the sub-volumes are placed in at least two groups. The groups are formed such that neighboring sub-volumes belong to different groups. To simultaneously excite a plurality of sub-volumes within a group, the MRI scanning apparatus 110 applies radio frequency (RF) pulses and a selection gradient to the target. In this example, the RF pulse may include a plurality of frequency components. The MRI scanning apparatus also performs 3D encoding for each of the excited sub-volumes. In addition, the MRI scanning apparatus obtains magnetic resonance signals from the sub-volumes.

The MRI scanning apparatus 110 applies the RF pulses including the plurality of frequency components and the selection gradient to the target located in a static magnetic field. The sub-volumes included in any one group are simultaneously excited. When the groups include a first group through an N-th group, the respective sub-volumes constituting the volume of the target are sequentially and iteratively included in the first through N-th groups, where "N" is a natural number that is equal to or greater than 2. For example, when the sub-volumes include a first sub-volume through an S-th sub-volume, each of the sub-volumes is sequentially placed into one of the first through N-th groups. Thus, the first sub-volume is placed in the first group, the second sub-volume is placed in the second group, through the N-th sub-volume which is included in the N-th group. Iteratively, the (N+1)th sub-volume is include placed into the first group, the (N+2)th sub-volume is placed in the second group, through the 2N-th sub-volume which is placed in the N-th group, and so on as necessary until all the sub-volumes are placed in a group. Accordingly, each of the first through the S-th sub-volumes are grouped in a way such that any one sub-volume belongs to a group that is different than the group for any adjacent sub-volume.

The first sub-volume through the S-th sub-volume constituting a target may be sequentially numbered based on any one direction. For example, given a standard direction in which a selection gradient is applied to a target, a first sub-volume may be the first sub-volume along the direction of the selection gradient and the final sub-volume may be the S-th sub-volume along the direction of the gradient. When the volume of a target is defined with respect to three dimensions including an x-axis, a y-axis, and a z-axis, the direction in which the selection gradient is applied may be selected as one of the axes, such as the z-axis. For example, the x-axis may denote a sagittal plane direction, the y-axis may denote a coronal plane direction, and the z-axis may denote an axial plane direction, a transverse plane direction, or a slice direction.

An example of at least two groups that are selected such that any neighboring sub-volumes of the sub-volumes constituting the volume of a target belong to different groups is described below with reference to FIGS. 2A and 2B.

The MRI scanning apparatus 110 applies RF pulses including the plurality of frequency components and the selection gradient to the target such that a plurality of sub-volumes included in the first group are simultaneously excited. Each of the RF pulses may have different phases.

In one example of simultaneously exciting M sub-volumes, the RF pulses applied to the target are multi-band RF pulses that are generated by modulating a single volume selective RF pulse according to a number M of designated sub-volumes.

In another example, the RF pulses applied to a target are spatially encoded RF pulses. For example, a Hadamard encoding method or a phase offset multiplanar volume imaging method may be used to excite the M designated sub-volumes.

Accordingly, each RF pulse can have 1) a frequency offset or 2) both a frequency offset and a phase offset. For example, the RF pulses may be defined by the following Equation 1:

$$\Psi(t) = A\Sigma_m \operatorname{sinc}(\gamma GDt) e^{j\gamma Gd(m)t} e^{j\varphi(m)} \qquad (1)$$

In Equation 1, $\psi(t)$ denotes RF pulses, A denotes a constant, m denotes the m-th sub-volume of the M sub-volumes that are simultaneously excited, $\gamma$ denotes a gyromagnetic ratio, G denotes a gradient, D denotes the thickness of a sub-volume, d(m) denotes the position of the m-th sub-volume, $\varphi$(m) denotes the phase of the m-th sub-volume, and t denotes time. For example, the gradient G in Equation 1 may be about one kHz/cm. As a frequency modulation and a phase modulation are performed on the RF pulses, a frequency offset and a phase offset may be implemented on the RF pulses. Also, since the RF pulses have different phases, RF phase encoding may be performed.

In one example of implementation of a frequency offset, while applying a selection gradient to a target located in a static magnetic field in a predetermined axial direction, the MRI scanning apparatus 110 applies RF pulses to the target including a frequency component corresponding to a Larmor frequency of each of the sub-volumes included in the first group to the target.

The Larmor frequency is a precession frequency of an atomic nucleus magnetic moment. An atomic nucleus has a magnetic moment or a magnetic dipole moment due to a spinning motion. When there is no external magnetic field surrounding an atom, the magnetic moment of an atomic nucleus is random, that is, there is no constant direction. When an atom is located in a static magnetic field, atomic nuclei are aligned in the static magnetic field in a direction to shift to a lower energy status, and the aligned atomic nuclei spin. As an atomic nucleus spins in the static magnetic field, the magnetic moment of the atomic nucleus performs a precessional motion. The precession frequency of the magnetic moment of an atomic nucleus is referred to as the Larmor frequency. For example, the Larmor frequency may be determined by a multiplication of a gyro-magnetic ratio and the intensity of an externally applied magnetic field.

The MRI scanning apparatus 110 applies the selection gradient to distribute a magnetic field that linearly varies based on a predetermined direction in the target located in a static magnetic field, and applies the RF pulses including a frequency component corresponding to the Larmor frequency of each of the sub-volumes included in the first group to simultaneously excite the sub-volumes included in the first group.

Figure 5:
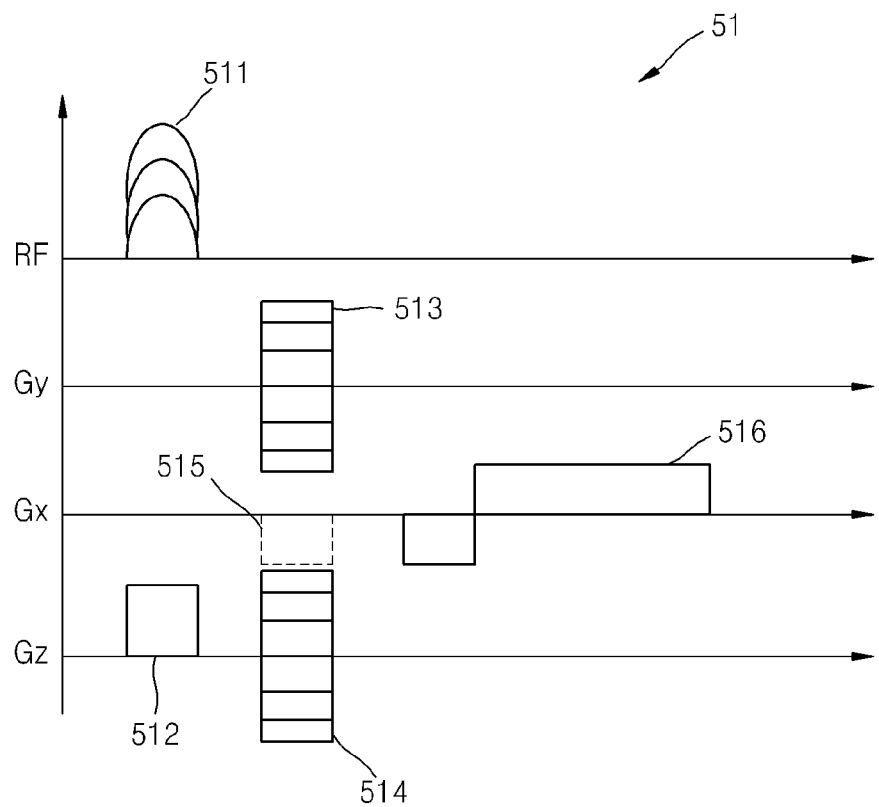
FIG. 5 illustrates an example of a pulse sequence applied to a target.

FIG. 5 illustrates an example of a pulse sequence applied to the target. Referring to both FIGS. 1 and 5, the MRI scanning apparatus 110 applies gradients 513, 514, and 516 to the target to perform 3D encoding for each of the sub-volumes that are excited as RF pulses 511 and selection gradient 512 are applied to the target. For example, the MRI scanning apparatus 110 performs 3D encoding by applying a first encoding gradient 513 with respect to a first direction, a second encoding gradient 514 with respect to a second direction, and a frequency encoding gradient 516 with respect to a third direction to the target. Any one of the first and second directions may be the same as the direction in which the selection gradient 512 is applied.

For example, the first encoding gradient 513, the second encoding gradient 514, and the frequency encoding gradient 516 may be applied to the target to provide information about a position in a y-axis direction, information about a position in a z-axis direction, and information about a position in an x-axis direction, respectively. Accordingly, the first encoding gradient 513 performs y-axis phase encoding, and the second encoding gradient 514 performs z-axis slice encoding or slice direction encoding. The z-axis slice encoding is described in greater detail below with reference to FIG. 3.

Referring back to FIG. 1, the MRI scanning apparatus 110 reads magnetic resonance signals from the sub-volumes by applying the frequency encoding gradient to the target. The frequency encoding gradient may be a read-out gradient. For example, the MRI scanning apparatus 110 applies a read-out gradient to the target to sample the magnetic resonance signals. While the read-out gradient is applied to the target, a gradient with respect to the direction in which the selection gradient is applied may not be applied, but this example is not limited thereto. When the selection gradient is applied in the z-axis direction, the read-out gradient may be applied in the x-axis direction.

In a gradient echo method, the polarity of a read-out gradient applied to the target may be changed from negative to positive. As such, as a read-out gradient having a negative polarity is applied to the target, the spin of an atomic nucleus is dephased. Then, as a read-out gradient having a positive polarity is applied to the target, the spin of an atomic nucleus is rephased by the same amount that the spin was dephased while the read-out gradient having the negative polarity was applied. Thus, the read-out gradient having a positive polarity acts as a rephasing or refocusing gradient. Magnetic resonance signals having the same frequency may be obtained due to rephasing or refocusing according to a read-out gradient having a polarity changed from negative to positive. Since magnetic resonance signals having the same frequency are obtained by the MRI scanning apparatus 110, image distortion is not generated, and the MRI scanning apparatus 110 generates a high resolution image.

In a spin echo method, a read-out gradient applied to a target may have a positive polarity. In this case, the MRI scanning apparatus 110 may apply a 180° pulse for rephasing or refocusing to the target.

The MRI scanning apparatus 110 performs 3D encoding on each of the excited sub-volumes and obtains magnetic resonance signals from the sub-volumes. The sub-volumes may indicate sub-volumes included in the first group excited by the RF pulses and the selection gradient. For example, the MRI scanning apparatus 110 obtains magnetic resonance signals using multi-channel receiving coils, and the magnetic resonance signals are obtained by the read-out gradient.

The data processing apparatus 120 reconstructs the magnetic resonance signals obtained from the MRI scanning apparatus 110 into image data corresponding to each of the sub-volumes. For example, the data processing apparatus 120 reconstructs the magnetic resonance signals into image data using a parallel imaging algorithm that takes into consideration channel information of the multi-channel receiving coils. The channel information of the multi-channel receiving coils indicates the coil sensitivity of each of the multi-channel receiving coils. However, the data processing apparatus 120 also may reconstruct the magnetic resonance signals into image data using a parallel imaging algorithm that takes into consideration information about the current elements of an RF coil.

Additionally, information about the sub-volumes is overlapped in the magnetic resonance signals obtained from each of the multi-channel receiving coils. Thus, the data processing apparatus 120 may reconstruct the magnetic resonance signals into image data corresponding to each of the sub-volumes by separating the overlapped information of the sub-volumes using the parallel imaging algorithm that takes into consideration the channel information of the multi-channel receiving coils. The parallel imaging algorithm may use sensitivity encoding (SENSE), generalized autocalibrating partially parallel acquisitions (GRAPPA), simultaneous acquisition of spatial harmonics (SMASH), and partially parallel imaging with localized sensitivities (PILS).

Accordingly, the data processing apparatus 120 may separate and reconstruct the magnetic resonance signals in which the information of the sub-volumes is overlapped into image data corresponding to each of the sub-volumes using a de-aliasing technique according to the parallel imaging algorithm and the channel information of the multi-channel receiving coils.

According to the examples of the MRI system 100 given herein, since the sub-volumes included in the first group are simultaneously excited while a magnetic resonance image scanning speed is increased, a high resolution 3D volume image having a high signal to noise ratio (SNR) may be generated.

Figure 2A:
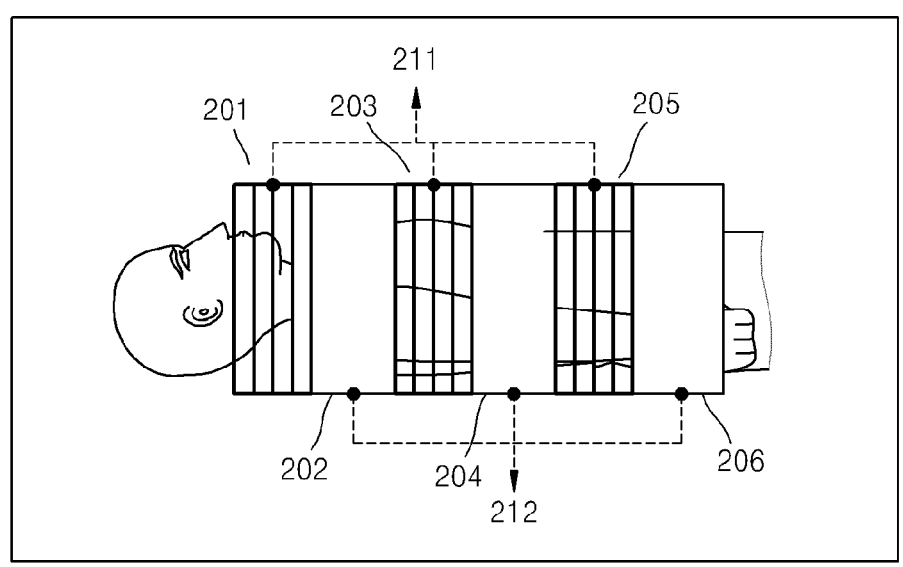
FIGS. 2A and 2B illustrate an example of a method of grouping a plurality of sub-volumes.
Figure 2B:
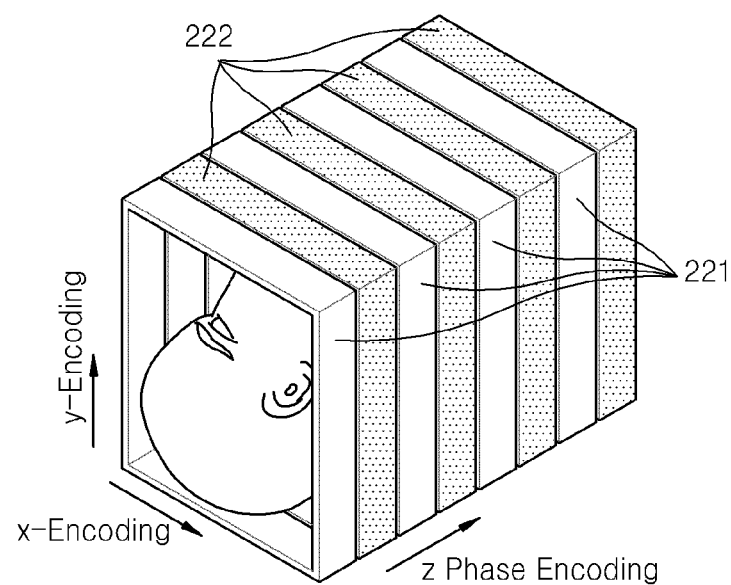

FIGS. 2A and 2B illustrate a method of grouping a plurality of sub-volumes. In FIGS. 2A and 2B, for convenience of explanation, the two groups that are grouped such that any neighboring sub-volumes of the sub-volumes constituting the volume of the target can belong to different groups. However, one will appreciate that the methods described herein also may be applied to three or more groups.

Referring to FIG. 2A, a first group 211 and a second group 212 are illustrated that each include three sub-volumes. Each of the sub-volumes included in the first group 211 is illustrated as including four slices that are stacked. Although, not illustrated, the sub-volumes included in the second group 212 also may include four slices that are stacked. However, the number of slices is for illustration only, and the sub-volumes may include two or more slices that are stacked.

The method of exciting the sub-volumes in the form of the stacked slices may prevent omission of image information due to an inter-slice gap between neighboring images that occurs in a 2D MRI technique that excites cross sections in units of slices.

As shown in FIG. 2A, the first group 211 includes a first sub-volume 201, a third sub-volume 203, and a fifth sub-volume 205, and the second group 212 includes a second sub-volume 202, a fourth sub-volume 204, and a sixth sub-volume 206. Accordingly, the MRI scanning apparatus 110 applies the RF pulses and selection gradient to the target to simultaneously excite the sub-volumes 201, 203, and 205 included in the first group 211. After image data reconstruction processing for the first group 211 is completed, the MRI apparatus 110 applies the RF pulses and selection gradient to the target to simultaneously excite the sub-volumes 202, 204, and 206 included in the second group 212.

As pointed out above, the MRI apparatus 110 applies first RF pulses and a first selection gradient to the target to simultaneously excite the sub-volumes 201, 203, and 205 included in the first group. The first RF pulses may include a plurality of frequency components. The frequency components may include a first frequency component to excite the first sub-volume 201, a second frequency component to excite the third sub-volume 203, and a third frequency component to excite the fifth sub-volume 205. Additionally, each of the first RF pulses may have a different phase. As such, the first RF pulses may have a frequency offset and a phase offset. For example, the first sub-volume 201 may be excited by an RF pulse having a first frequency component and a first phase among the first RF pulses, the third sub-volume 203 may be excited by an RF pulse having a second frequency component and a second phase among the first RF pulses, and the fifth sub-volume 205 may be excited by an RF pulse having a third frequency component and a third phase among the first RF pulses.

After exciting the sub-volumes 201, 203, and 205 included in the first group 211, the MRI scanning group 110 may apply second RF pulses and a second selection gradient to the target in the same manner to simultaneously excite the sub-volumes 202, 204, and 206 included in the second group 212.

FIG. 2B illustrates a first group 221 and a second group 222. Referring to FIG. 2B, the first sub-volume, the third sub-volume, the fifth sub-volume, and the seventh sub-volume with respect to the z-axis direction are included in the first group 221, and the second sub-volume, the fourth sub-volume, the sixth sub-volume, and the eighth sub-volume with respect to the z-axis direction are included in the second group 222. In this example, a first encoding gradient (e.g., a phase encoding gradient) with respect to a first direction (e.g., the y-axis direction) and a second encoding gradient (e.g., a slice encoding gradient) with respect to a second direction (e.g., the z-axis direction) are applied to the target by the MRI scanning apparatus 110 of FIG. 1 to perform 3D encoding.

The method of simultaneously exciting the sub-volumes in each group reduces the time need to perform slice encoding in the second direction. For example, the number of times slice encoding is performed with respect to the second direction may be reduced proportionally to the number of the sub-volumes included in each group. As illustrated in FIG. 2B, for example, when four sub-volumes are included in each of the first and second groups 221 and 222, the number of times slice encoding is performed with respect to the z-axis direction is reduced to ¼ as compared to not performing grouping at all. As the scan time is reduced, the MRI system 100 can more quickly generate a high resolution 3D full volume image.

Figure 3:
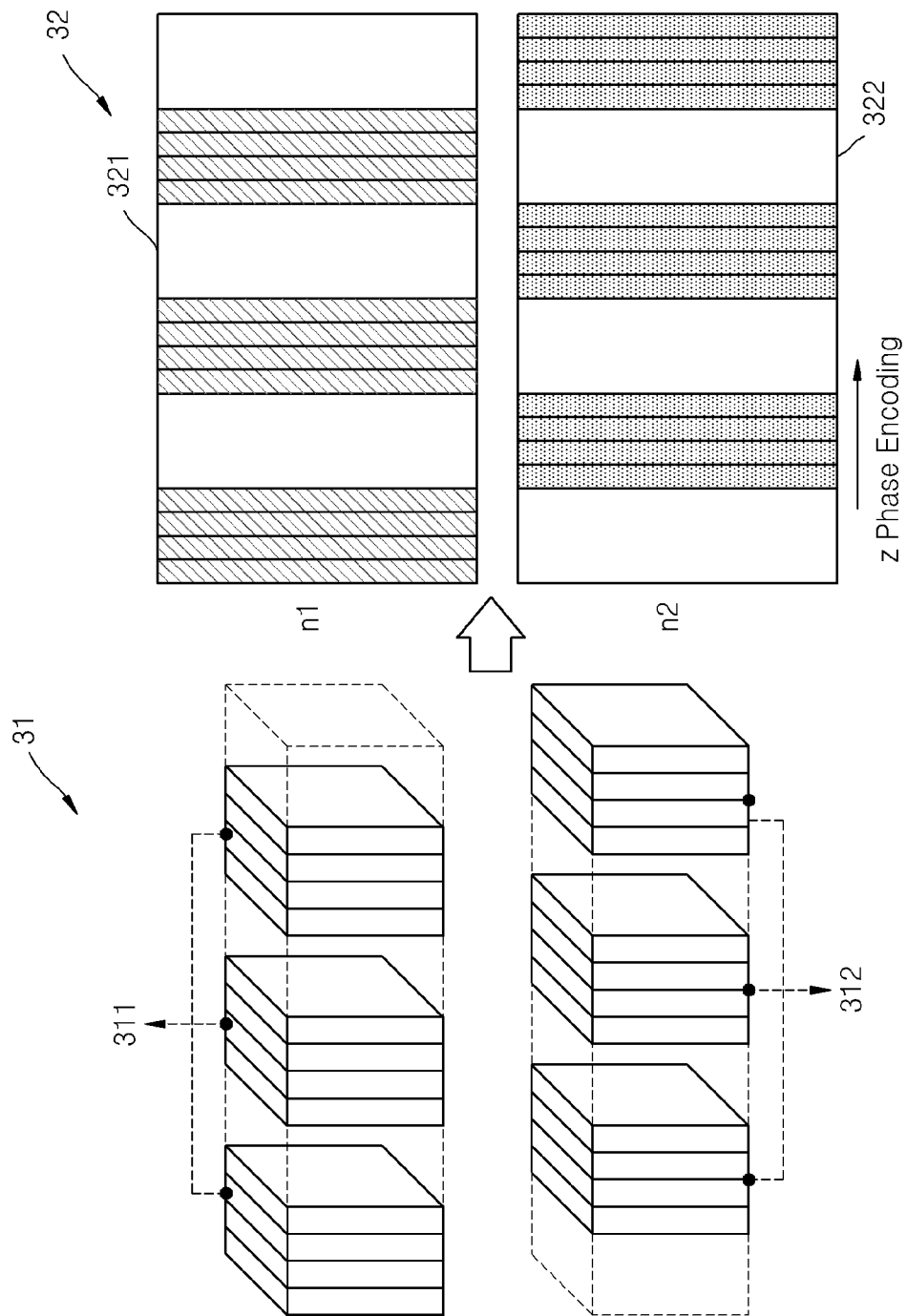
FIG. 3 illustrates an example of a multi-volume imaging technique for each of the groups.

FIG. 3 illustrates a multi-volume imaging technique for multiple groups. As shown in FIG. 3, a section 31 includes groups of sub-volumes that are simultaneously excited. For example, the sub-volumes included in the first group 311 are simultaneously excited, and the sub-volumes included in the second group 312 also are simultaneously excited. When the number of groups is n and the number of sub-volumes that are simultaneously excited is M, the total volume of a target is divided into M×n parts and 3D MRI is performed. Referring to FIG. 3, three sub-volumes are included in each of the first and second groups 311 and 312 and thus the target divided into six parts is scanned into a 3D magnetic resonance image.

FIG. 3 also includes a section 32 showing z-axis encoding. For example, z-axis encoding is performed for the first group 311 as shown in 321, and z-axis encoding is performed for the second group 312 as shown in 322.

It is assumed that frequency encoding is performed with respect to the x-axis direction, phase encoding is performed with respect to the y-axis direction, and slice encoding is performed with respect to the z-axis direction. Assuming that the number of times z-axis slice encoding is performed with respect to the total volume of a target is Nz when the sub-volumes constituting the target are not grouped into a plurality of groups, the number of times z-direction slice encoding is performed in the MRI system 100 of FIG. 1 in which the sub-volumes constituting the target are grouped into n groups each including M sub-volumes that are simultaneously excited is Nz/M.

Furthermore, assuming the number of times y-axis phase encoding is performed with respect to the total volume of a target is Ny and the number of times z-axis slice encoding is performed with respect to the total volume of the target is Nz when the sub-volumes constituting the target are not grouped into a plurality of groups, a total scan time with respect to the total volume of the target is TA=(Ny)×(Nz) when the sub-volumes constituting the target are not grouped into a plurality of groups. In contrast, in the MRI system 100 of FIG. 1 in which the sub-volumes constituting the target are grouped into n groups each including M sub-volumes that are simultaneously excited, the total scan time with respect to the total volume of the target is TA'=(Ny)×(Nz/M)=TA/M.

The number of times z-axis slice encoding is performed in the MRI system 100 and the total scan time in the MRI system 100 described above are the minimum number of times z-axis slice encoding may be performed in the MRI system 100 and the minimum total scan time in the MRI system 100. However, in certain situations, it may not be possible to achieve these minimums. For example, when there are overlapping areas in the sub-volumes, the number of times z-axis slice encoding is performed may be greater than Nz/M, and accordingly the total scan time may be increased.

Since the MRI technique according to the examples shown in FIGS. 1-3 performs 3D encoding while simultaneously exciting the sub-volumes that are in the form of a stack of slices, the number of times z-axis encoding is performed is reduced. Therefore, the total scan time needed to obtain the total volume image of a target is reduced. In addition, performing MRI in a plurality of orientations to remove any gap between slices when 2D encoding is performed in units of slices may not be necessary since the 3D encoding is performed in units of sub-volumes that are in the form of a stack of slices.

Figure 4:
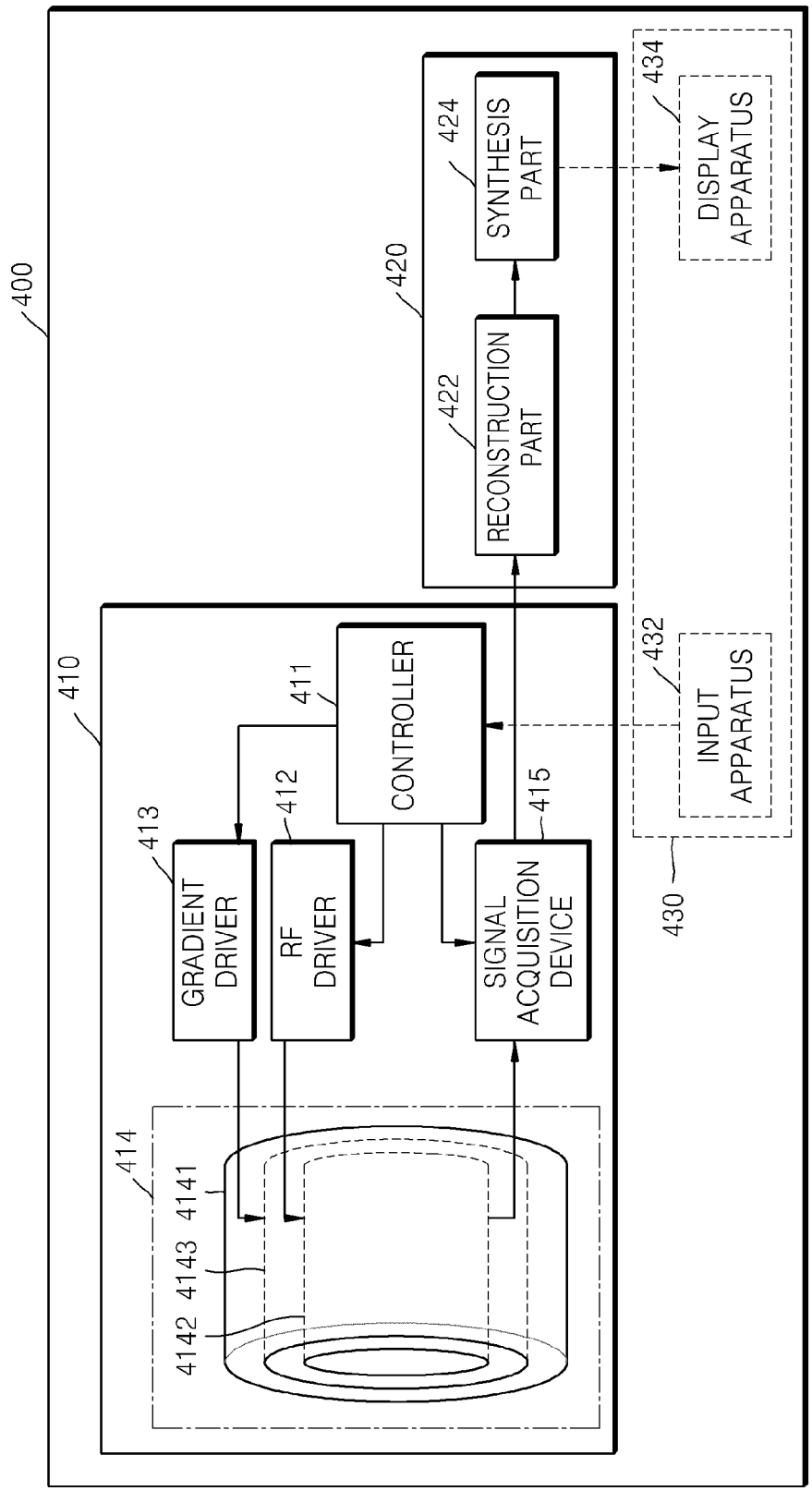
FIG. 4 illustrates another example of an MRI system.

FIG. 4 illustrates another example of an MRI system 400. As shown in FIG. 4, the MRI system 400 includes the MRI scanning apparatus 410, the data processing apparatus 420, and a user interface 430. The MRI scanning apparatus 410 includes a controller 411, an RF driver 412, a gradient driver 413, a magnet apparatus 414, and a signal acquisition device 415. The magnet apparatus 414 includes a magnetic force generator 4141, RF coils 4142, and gradient coils 4143. The data processing apparatus 420 includes a reconstruction part 422 and a synthesis part 424. The user interface 430 includes an input apparatus 432 and a display apparatus 434. The descriptions provided above with regard to the MRI system 100 of FIG. 1 also apply to the MRI system 400 of FIG. 4 and any redundant description is omitted herein for brevity.

The MRI system 400 obtains an image including information about biological tissue of a target in a non-invasive manner. In one example, the image may be a 3D volume image. The MRI scanning apparatus 410 acquires magnetic resonance signals irradiated from a target by applying a predetermined pulse sequence to the target.

The controller 411 controls the overall operation of the MRI scanning apparatus 410. For example, the controller 411 controls the RF driver 412, the gradient driver 413, the magnet apparatus 414, and the signal acquisition device 415. The RF driver 412 controls the RF coils 4142 and the gradient driver 413 controls the gradient coils 4143.

The magnet apparatus 414 applies a magnetic field, RF pulses, and gradient to the target and acquires magnetic resonance signals from the target. To measure a magnetic characteristic of the target, the magnet apparatus 414 may be located in an externally shielded space. However, the descriptions provided herein also apply to an open type apparatus.

The magnetic force generation unit 4141 generates a magnetic force to locate the target in a static magnetic field.

The RF coils 4142 apply RF pulses including a plurality of frequency components to the target and acquire magnetic resonance signals from the target. The RF coils 4142 may include any one of transmission RF coils and receiving RF coils or transceiving RF coils. In the following description, for convenience of explanation, the RF coils 4142 are described as classified into an RF transmission coil and an RF receiving coil, however, other configurations are possible.

The RF pulses applied to the target from the RF transmission coil of the RF coils 4142 may include any one of multi-band RF pulses or space encoding RF pulses. The RF receiving coil of the RF coils 4142 acquires signals from the target and outputs the acquired signals to the data processing apparatus 420. The RF receiving coil may be a multi-channel receiving coil. For example, the RF receiving coil may be a multi-channel receiving coil including 32 channels.

The gradient coils 4143 apply a selection gradient, a first encoding gradient, a second encoding gradient, and a frequency encoding gradient to the target. For example, the gradient coils 4143 include a z coil configured to apply the selection gradient and the second encoding gradient, an x coil configured to apply the frequency encoding gradient, and a y coil configured to apply the first encoding gradient.

A pulse sequence of the signals applied by the RF coils 4142 and the gradient coils 4143 to the target are described below in detail with reference to FIG. 5.

The signal acquisition device 415 acquires magnetic resonance signals output from the RF coils 4142 and is configured to process the acquired magnetic resonance signals. For example, the signal acquisition device 415 may be an amplifier configured to amplify the acquired magnetic resonance signals, a demodulator configured to demodulate the amplified magnetic resonance signals, and an analog to digital converter (ADC) configured to convert the demodulated magnetic resonance signals into a digital form. Also, the signal acquisition device 415 may further include a storage device configured to store a magnetic resonance signal that is converted into a digital form.

The data processing apparatus 420 performs predetermined processing on the magnetic resonance signals output from the MRI scanning apparatus 410.

The reconstruction part 422 of the processing apparatus 420 reconstructs the magnetic resonance signals output from the MRI scanning apparatus 410 into image data corresponding to each of the sub-volumes. In addition, to perform reconstruction processing, the reconstruction part 422 may configure a k-space using the magnetic resonance signals output from the MRI scanning apparatus 410 and perform Fourier transformation on k-space data constituting the k-space. The k-space data includes image data with respect to the sub-volumes in an overlapped form.

In further detail, the multi-channel receiving coils receive magnetic resonance signals of an overlapped image with respect to all of the excited sub-volumes. Taking into consideration the channel information of the multi-channel receiving coils, the reconstruction part 422 separates the magnetic resonance signals of the overlapped image into image data of each of the sub-volumes. Additionally, when each of the RF pulses applied to the target from the RF coils 4142 has a different phase, the reconstruction part 422 may further consider the channel information of the multi-channel receiving coils and a phase of each of the RF pulses.

A parallel imaging algorithm is one example of a technique to increase a scanning speed by de-aliasing signals for which aliasing occurs as the number of sampling lines for acquiring a signal decreases. For example, the parallel imaging algorithm may utilize a SENSE technique using coil field sensitivity corresponding to the channel information of each of the multi-channel receiving coils and a GRAPPA technique that estimates a value of a surrounding un-acquired signal line of the acquired magnetic resonance signals using an auto-calibration signal (ACS) kernel. The reconstruction part 422 reconstructs the overlapped magnetic resonance signals into image data corresponding to each of the sub-volumes using the de-aliasing technique of the parallel imaging algorithm and the channel information of the multi-channel receiving coils, which is described below in greater detail with reference to FIG. 7.

The synthesis part 424 of the processing apparatus 420 synthesizes the image data reconstructed by the reconstruction part 422. The synthesis may include combination processing. For example, when a target is divided into first and second groups, the MRI scanning apparatus 410 applies RF pulses including a plurality of frequency components and a selection gradient to the target to simultaneously excite the sub-volumes included in the first group, performs 3D encoding on each of the excited sub-volumes, and acquires magnetic resonance signals from the sub-volumes. The reconstruction part 422 reconstructs the acquired magnetic resonance signals into image data corresponding to each of the sub-volumes included in the first group. In the same manner, the MRI scanning apparatus 410 acquires magnetic resonance signals from the sub-volumes included in the second group and the reconstruction part 422 reconstructs the acquired magnetic resonance signals into image data corresponding to each of the sub-volumes included in the second group. The synthesis part 424 may combine the image data corresponding to each of the sub-volumes included in the first group and the image data corresponding to each of the sub-volumes included in the second group to generate a total volume image of the target.

The user interface 430 acquires input information from a user and displays output information to a user. Although the input apparatus 432 and the display apparatus 434 are separated in FIG. 4 for convenience of explanation, the input apparatus 432 and the display apparatus 434 may be incorporated in a device.

The input apparatus 432 acquires input information to select a resolution of a magnetic resonance image and a thickness of each slice from a user. The display apparatus 434 displays the total volume image of the target generated by the synthesis part 424 and an image about an area of interest of the total volume image of the target. Although FIG. 4 illustrates that the MRI system 400 includes the display apparatus 434, the display apparatus 434 also may be provided external to the MRI system 400.

FIG. 5 illustrates an example of a pulse sequence 51 applied to a target. Referring to FIGS. 4 and 5, the RF pulses 511 and the selection gradient 512 are applied to a target to simultaneously excite the sub-volumes included in the first group of a plurality of groups constituting the target. The RF coils 4142 apply the RF pulses 511 to the target, and the gradient coils 4143 apply the selection gradient 512 using the z coil.

To perform 3D encoding on the excited sub-volumes, the first encoding gradient 513 and the second encoding gradient 514 are applied to the target. Each of the first and second encoding gradients 513 and 514 may be applied by the y coil and the z coil of the gradient coils 4143. In this example, the first encoding gradient 513 performs phase encoding with respect to the y axis direction, and the second encoding gradient 514 performs slice encoding with respect to the z axis direction.

In addition, the frequency encoding gradient 515 also may be applied with the first and second encoding gradients 513 and 154; however, this is not a requirement. The frequency encoding gradient 515 may be applied by the x coil of the gradient coils 4143.

The frequency encoding gradient 516 is applied to the target to read out the magnetic resonance signals from the sub-volumes. The frequency encoding gradient 516 is applied by the x coil of the gradient coils 4143. Since the frequency encoding gradient 515 is applied after the first and second encoding gradients 513 and 514 are applied, the MRI scanning apparatus 410 may perform 3D encoding. The first encoding gradient 513, the second encoding gradient 514, and the frequency encoding gradient 515 are interrelated and may be used to perform space encoding on the target.

When the gradient echo method is applied to the pulse sequence 51 of FIG. 5, the polarity of the frequency encoding gradient 516 may be changed from the negative to the positive.

Figure 6:
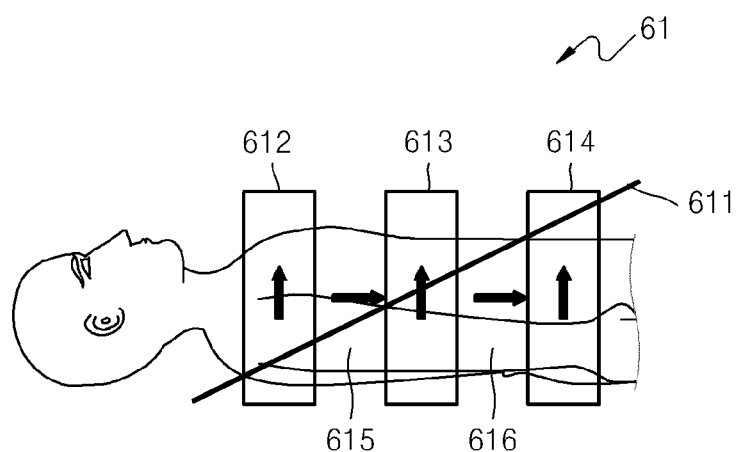
FIG. 6 illustrates an example of the sub-volumes being excited at the same time.

FIG. 6 illustrates an example of the sub-volumes being excited at the same time. Referring to the pulse sequence 51 of FIG. 5 and a multi-volume imaging technique 61 of FIG. 6, as the selection gradient 512 is applied to the target existing in a static magnetic field, a linearly varying magnetic field gradient 611 is generated in the target. Accordingly, each of a plurality of sub-volumes 612 through 616 constituting the target has a different Larmor frequency.

When the first sub-volume 612, the third sub-volume 613, and the fifth sub-volume 614 are included in a first group, the RF pulses 511 having a plurality of frequency components that excite the first sub-volume 612, the third sub-volume 613, and the fifth sub-volume 614 are applied to the target to simultaneously excite the sub-volumes 612, 613, and 614 included in the first group. Additionally, when the RF pulses 511 having a plurality of frequency components have different phases, the first sub-volume 612 may be excited by an RF pulse having a first Larmor frequency and a first phase, the third sub-volume 613 may be excited by an RF pulse having a third Larmor frequency and a third phase, and the fifth sub-volume 614 may be excited by an RF pulse having a fifth Larmor frequency and a fifth phase. The first, third, and fifth phases are considered in performing image data reconstruction work on the simultaneously excited first, third, and fifth sub-volumes 612, 613, and 614, and thus image data with less distortion may be reconstructed.

Figure 7:
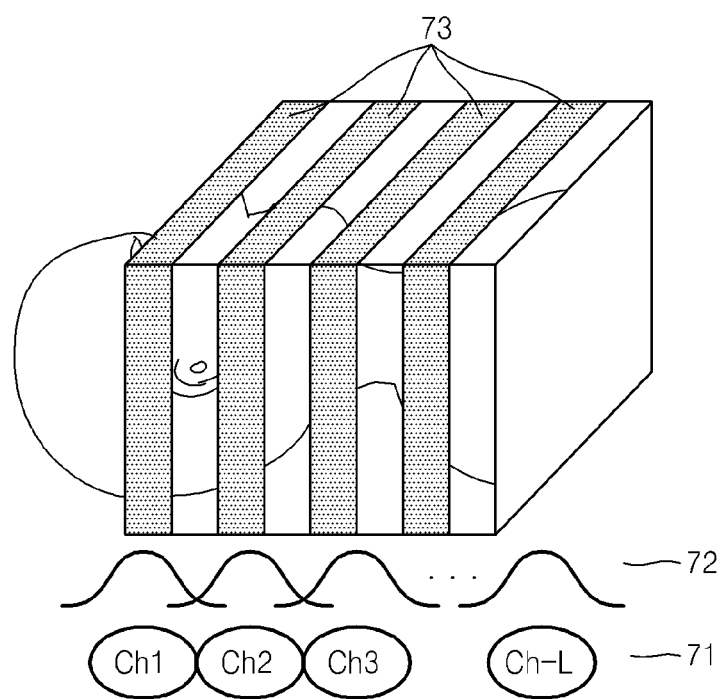
FIG. 7 illustrates an example of reconstruction processing of image data.

FIG. 7 illustrates an example of reconstruction processing of image data. As shown in FIG. 7, multi-channel RF receiving coils 71 including L channels and a coil field map 72 for each of the coils are illustrated. The coil field map 72 may be a sensitivity profile with respect to each coil included in the multi-channel RF receiving coils 71. As the sub-volumes included in the first group 73 of the sub-volumes constituting the target are simultaneously excited, the multi-channel RF receiving coils 71 acquire magnetic resonance signals from the sub-volumes included in the first group 73.

When a signal received from the multi-channel RF receiving coils 71 (e.g., including 32 channels) is S, the coil field map 72 with respect to each of the multi-channel RF receiving coils 71 is B, and a signal indicating reconstructed image data with respect to the sub-volumes included in the first group 73 is F, the signals S, B, and F may be defined by Equations 2 and 3 below.

$$S = (bR)F = BF \quad (2)$$

$$\begin{bmatrix} S_0 \\ S_1 \\ S_2 \\ \vdots \\ S_{31} \end{bmatrix} = \begin{bmatrix} B_0^0 & \cdots & B_0^3 \\ B_1^0 & \cdots & B_1^3 \\ B_2^0 & \cdots & B_2^3 \\ \vdots & & \vdots \\ B_{31}^0 & \vdots & B_{31}^3 \end{bmatrix} \begin{bmatrix} f^0 \\ f_1 \\ f^2 \\ f^3 \end{bmatrix} \quad (3)$$

In Equation 2, b denotes a sensitivity profile with respect to each coil included in the multi-channel RF receiving coils 71. When RF pulses having a plurality of frequency components and a plurality of phases are applied to each of the sub-volumes included in the first group 73, R may denote the phase information of each sub-volume. R may be expressed as a matrix indicating a phase change for each sub-volume. For example, the first sub-volume included in the first group 73 is excited by an RF pulse having a first Larmor frequency and a first phase, and the second sub-volume included in the first group 73 is excited by an RF pulse having a second Larmor frequency and a second phase. In the same manner each of the sub-volumes included in the first group 73 may be excited by a different Larmor frequency and a different phase. As expressed in Equation 2, B denotes the coil field map 72 and may be defined by the product of R denoting the phase information of RF pulses and b denoting the sensitivity profile with respect to each coil included in the multi-channel RF receiving coils 71.

However, when the RF pulses having a plurality of frequency components have the same phase, the coil field map 72 may be defined without considering the phase information of RF pulses. In this case, an identity matrix may be used for R corresponding to the phase information of Equation 2.

In Equation 3, $S_p$ denotes a signal received from a p-th channel coil of the multi-channel RF receiving coils 71. $B_p^m$ denotes a coil field map with respect to an m-th sub-volume of the sub-volume included in the first group 73 and the p-th channel coil of the multi-channel RF receiving coils 71. Also, $f^m$ denotes image data with respect to the m-th sub-volume of the sub-volumes included in the first group 73. Thus, the reconstruction part 422 may perform an operation as shown in Equation 4 below to reconstruct the magnetic resonance signals received from the multi-channel RF receiving coils 71 into image data corresponding to each of the sub-volumes included in the first group 73.

$$F = (B^T \cdot B)^{-1} \cdot B^T \cdot S \quad (4)$$

In Equation 4, the superscript T in a matrix denotes a transpose matrix with respect to the matrix.

As such, the reconstruction part 422 may reconstruct the overlapped magnetic resonance signals into image data corresponding to each of the sub-volumes using the channel information of the multi-channel RF receiving coils 71 and the de-aliasing technique of a parallel imaging algorithm.

As the magnetic resonance signals overlapped in the multi-channel RF receiving coils 71 are received, the magnetic resonance signals overlapped in the k-space may be separated using RF decoding taking into consideration the coil sensitivity and the phase information of the RF pulses. However, when the phase information of the RF pulses is not used, the RF decoding may be performed without consideration to the phase information of the RF pulses.

Figure 8:
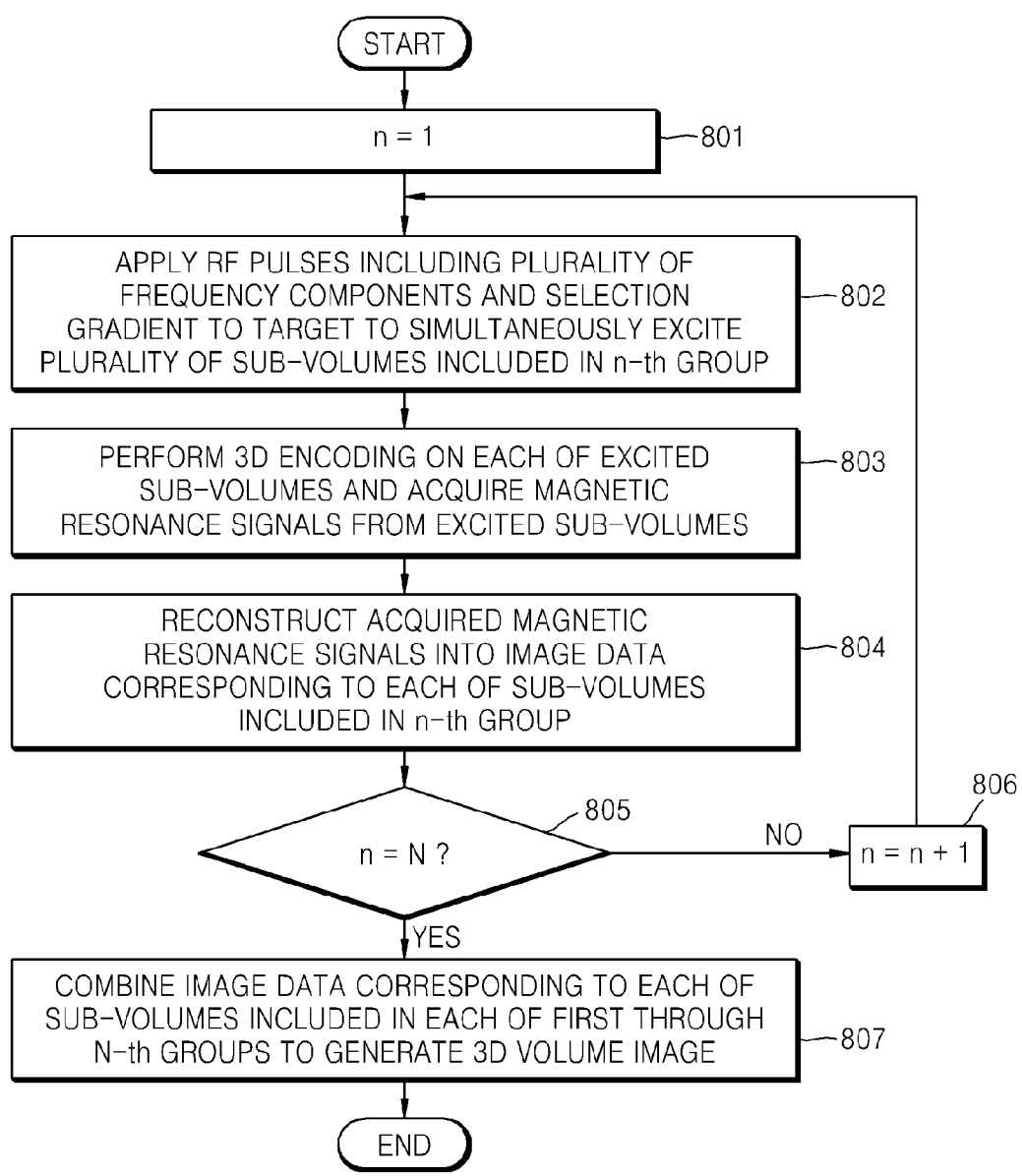
FIG. 8 is a flowchart for an example of a method of performing an MRI.

FIG. 8 is a flowchart of an example of an MRI method. Referring to FIG. 8, the MRI method includes operations that are processed in time series in the MRI systems 100 and 400 of FIGS. 1 and 4. Thus, even when omitted in the following description, the examples described above with regard to the MRI systems 100 and 400 may be applied to the MRI method shown in FIG. 8. For convenience of explanation the following description uses an example in which a target is divided into N groups is described.

In operation 801, the controller 411 of the MRI scanning apparatus 410 sets n to 1.

In operation 802, the MRI scanning apparatus 410 applies RF pulses including a plurality of frequency components and a selection gradient to a target to simultaneously excite a plurality of sub-volumes included in the n-th group of the N groups. The N groups are formed such that any neighboring sub-volumes of a particular sub-volume belong to a different group. The RF coils 4142 apply the RF pulses under the control of the RF driver 412 of the MRI scanning apparatus 410, and the gradient coils 4143 apply the selection gradient under the control of the gradient driver 413 of the MRI scanning apparatus 410.

In operation 803, the MRI scanning apparatus 410 performs 3D encoding on each of the excited sub-volumes and acquires magnetic resonance signals from the excited sub-volumes. For example, to perform the 3D encoding, the MRI scanning apparatus 410 applies a first encoding gradient with respect to a first direction and a second encoding gradient with respect to a second direction. Either the first direction or the second direction may be the same as the direction in which the selection gradient is applied in the operation 801. The gradient coils 4143 may apply the first and second encoding gradients under the control of the gradient driver 413 of the MRI scanning apparatus 410.

In operation 804, the reconstruction part 422 of the data processing apparatus 420 reconstructs the magnetic resonance signals acquired in the operation 803 into image data corresponding to each of the sub-volumes included in the n-th group.

In operation 805, the controller 411 of the MRI scanning apparatus 410 determines whether the operations 802 through 804 have been performed on all of the N groups constituting the target. If a result of the determination is that the operations 802 through 804 have not been performed on all of the N groups constituting the target, operation 806 is performed. Otherwise, operation 807 is performed.

In operation 806, the controller 411 of the MRI scanning apparatus 410 increases the value of n by 1 and operation 802 is performed on the n+1-th group.

In operation 807, the synthesis part 424 combines the image data corresponding to each of the sub-volumes included in each of the first through N-th groups constituting the target to generate a 3D volume image.

Accordingly, the MRI method quickly generates a high resolution 3D volume image.

According to the MRI method and the MRI systems 100 and 400, a multi-volume excitation technique to simultaneously excite a plurality of sub-volumes is used. 3D gradient encoding with respect to the x-axis, the y-axis, and the z-axis is performed. RF encoding with regard to the RF pulses having different phases is performed. In addition, an image is reconstructed using coil sensitivity and RF decoding.

As described above, according to the description herein, high resolution image data or a high resolution volume image can be quickly obtained.

The MRI system 100, the MRI scanning apparatus, the data processing apparatus 120 in FIG. 1 and the MRI system 400, the MRI scanning apparatus 410, controller 411, the RF driver 412, the gradient driver 413, the magnet apparatus 414, the signal acquisition device 415, the data processing apparatus 420, the reconstruction part 422, the synthesis part 424, the user interface 430, the input apparatus 432, and the display apparatus 434 shown in FIG. 4 described above that perform the operations illustrated in FIGS. 2A, 2B, 3, and 5-8 may be implemented using one or more hardware components, one or more software components, or a combination of one or more hardware components and one or more software components.

A hardware component may be, for example, a physical device that physically performs one or more operations, but is not limited thereto. Examples of hardware components include resistors, capacitors, inductors, power supplies, frequency generators, operational amplifiers, power amplifiers, low-pass filters, high-pass filters, band-pass filters, analog-to-digital converters, digital-to-analog converters, and processing devices.

A software component may be implemented, for example, by a processing device controlled by software or instructions to perform one or more operations, but is not limited thereto. A computer, controller, or other control device may cause the processing device to run the software or execute the instructions. One software component may be implemented by one processing device, or two or more software components may be implemented by one processing device, or one software component may be implemented by two or more processing devices, or two or more software components may be implemented by two or more processing devices.

A processing device may be implemented using one or more general-purpose or special-purpose computers, such as, for example, a processor, a controller and an arithmetic logic unit, a digital signal processor, a microcomputer, a field-programmable array, a programmable logic unit, a microprocessor, or any other device capable of running software or executing instructions. The processing device may run an operating system (OS), and may run one or more software applications that operate under the OS. The processing device may access, store, manipulate, process, and create data when running the software or executing the instructions. For simplicity, the singular term "processing device" may be used in the description, but one of ordinary skill in the art will appreciate that a processing device may include multiple processing elements and multiple types of processing elements. For example, a processing device may include one or more processors, or one or more processors and one or more controllers. In addition, different processing configurations are possible, such as parallel processors or multi-core processors.

A processing device configured to implement a software component to perform an operation A may include a processor programmed to run software or execute instructions to control the processor to perform operation A. In addition, a processing device configured to implement a software component to perform an operation A, an operation B, and an operation C may have various configurations, such as, for example, a processor configured to implement a software component to perform operations A, B, and C; a first processor configured to implement a software component to perform operation A, and a second processor configured to implement a software component to perform operations B and C; a first processor configured to implement a software component to perform operations A and B, and a second processor configured to implement a software component to perform operation C; a first processor configured to implement a software component to perform operation A, a second processor configured to implement a software component to perform operation B, and a third processor configured to implement a software component to perform operation C; a first processor configured to implement a software component to perform operations A, B, and C, and a second processor configured to implement a software component to perform operations A, B, and C, or any other configuration of one or more processors each implementing one or more of operations A, B, and C. Although these examples refer to three operations A, B, C, the number of operations that may implemented is not limited to three, but may be any number of operations required to achieve a desired result or perform a desired task.

Software or instructions for controlling a processing device to implement a software component may include a computer program, a piece of code, an instruction, or some combination thereof, for independently or collectively instructing or configuring the processing device to perform one or more desired operations. The software or instructions may include machine code that may be directly executed by the processing device, such as machine code produced by a compiler, and/or higher-level code that may be executed by the processing device using an interpreter. The software or instructions and any associated data, data files, and data structures may be embodied permanently or temporarily in any type of machine, component, physical or virtual equipment, computer storage medium or device, or a propagated signal wave capable of providing instructions or data to or being interpreted by the processing device. The software or instructions and any associated data, data files, and data structures also may be distributed over network-coupled computer systems so that the software or instructions and any associated data, data files, and data structures are stored and executed in a distributed fashion.

For example, the software or instructions and any associated data, data files, and data structures may be recorded, stored, or fixed in one or more non-transitory computer-readable storage media. A non-transitory computer-readable storage medium may be any data storage device that is capable of storing the software or instructions and any associated data, data files, and data structures so that they can be read by a computer system or processing device. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, or any other non-transitory computer-readable storage medium known to one of ordinary skill in the art.

Functional programs, codes, and code segments for implementing the examples disclosed herein can be easily constructed by a programmer skilled in the art to which the examples pertain based on the drawings and their corresponding descriptions as provided herein.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the detailed description.

What is claimed is:

1. A magnetic resonance imaging (MRI) method, the MRI method comprising:
    applying radio frequency (RF) pulses, each comprising a frequency component and each having a different phase, and a selection gradient to a target volume to simultaneously excite sub-volumes included in each group of groups constituting the target volume, wherein neighboring sub-volumes of all sub-volumes constituting the target volume belong to different groups;
    acquiring magnetic resonance signals from the sub-volumes by performing 3D encoding on each of the excited sub-volumes; and
    reconstructing the acquired magnetic resonance signals into image data corresponding to each of the sub-volumes using a parallel imaging algorithm that uses phase information of the RF pulses and channel information of multi-channel receiving coils used to acquire the magnetic resonance signals, the channel information comprising a sensitivity profile with respect to each coil included in the multi-channel receiving coils.

2. The MRI method of claim 1, wherein the groups comprise a first group through an N-th group, where N is a natural number that is equal to or greater than two; and
    the MRI method further comprises sequentially and iteratively assigning the sub-volumes to one of the first to N-th groups.

3. The MRI method of claim 1, wherein the acquiring of the magnetic resonance signals from the sub-volumes by performing 3D encoding on each of the excited sub-volumes comprises applying a first encoding gradient with respect to a first direction and a second encoding gradient with respect to a second direction to each of the excited sub-volumes, where either the first direction or the second direction is the same as a direction in which the selection gradient is applied.

4. The MRI method of claim 1, further comprising applying a read-out gradient to the target volume to read out magnetic resonance signals from the sub-volumes,
    wherein the acquiring of the magnetic resonance signals from the sub-volumes comprises acquiring the read-out magnetic resonance signals from the sub-volumes using the multi-channel receiving coils.

5. The MRI method of claim 1, further comprising combining the image data corresponding to each of the sub-volumes included in each group of the groups.

6. The MRI method of claim 1, further comprising synthesizing the image data corresponding to each of the sub-volumes to generate a 3D volume image.

7. A magnetic resonance imaging (MRI) method, the MRI method comprising:
    applying a pulse sequence comprising pulses, each having a different phase, to a target volume to simultaneously excite sub-volumes included in a group of groups constituting the target volume, wherein neighboring sub-volumes of all sub-volumes constituting the target volume belong to different groups;
    reconstructing image data from magnetic resonance signals corresponding to each sub-volume of sub-volumes included in the group using a parallel imaging algorithm that uses phase information of the pulses and channel information of multi-channel receiving coils used to acquire the magnetic resonance signals, the channel information comprising a sensitivity profile with respect to each coil included in the multi-channel receiving coils;
    repeating the applying of the pulse sequence and the reconstructing of the image data for each group of the groups constituting the target volume until the reconstructing of the image data has been performed for all groups constituting the target volume; and
    generating a 3D volume image by combining the image data corresponding to each of the sub-volumes included in each of the groups constituting the target volume after the reconstructing of the image data has been performed for all of the groups constituting the target volume.

8. The MRI method of claim 7, wherein the groups comprise a first group through an N-th group, where N is a natural number that is equal to or greater than two; and
    the MRI method further comprises sequentially and iteratively assigning the sub-volumes to one of the first to N-th groups.

9. A non-transitory computer-readable storage medium storing instructions that, when executed by a processor, cause the processor to perform a method, the method comprising:
    applying radio frequency (RF) pulses, each comprising a frequency component and each having a different phase, and a selection gradient to a target volume to simultaneously excite sub-volumes included in each group of groups constituting the target volume, wherein neighboring sub-volumes of all sub-volumes constituting the target volume belong to different groups;
    acquiring magnetic resonance signals from the sub-volumes by performing 3D encoding on each of the excited sub-volumes; and
    reconstructing the acquired magnetic resonance signals into image data corresponding to each of the sub-volumes using a parallel imaging algorithm that uses phase information of the RF pulses and channel information of multi-channel receiving coils used to acquire the magnetic resonance signals, the channel information comprising a sensitivity profile with respect to each coil included in the multi-channel receiving coils.

10. A non-transitory computer-readable storage medium storing instructions that, when executed by a processor, cause the processor to perform a method, the method comprising:
applying a pulse sequence comprising pulses, each having a different phase, to a target volume to simultaneously excite sub-volumes included in a group of groups constituting the target volume, wherein neighboring sub-volumes of all sub-volumes constituting the target volume belong to different groups;
reconstructing the image data from magnetic resonance signals corresponding to each sub-volume of sub-volumes included in the group using a parallel imaging algorithm that uses phase information of the pulses and channel information of multi-channel receiving coils used to acquire the magnetic resonance signals, the channel information comprising a sensitivity profile with respect to each coil included in the multi-channel receiving coils;
repeating the applying of the pulse sequence and the reconstructing of the image data for each group of the groups constituting the target volume until the reconstructing of the image data has been performed for all groups constituting the target volume; and
generating a 3D volume image by combining the image data corresponding to each of the sub-volumes included in each of the groups constituting the target volume after the reconstructing of the image data has been performed for all of the groups constituting the target volume.

11. A magnetic resonance imaging (MRI) system comprising:
an MRI scanner configured to:
apply radio frequency (RF) pulses, each comprising a frequency component and each having a different phase, and a selection gradient to a target volume to simultaneously excite sub-volumes included in each group of groups constituting the target volume, wherein neighboring sub-volumes of all sub-volumes constituting the target volume belong to different groups; and
acquire magnetic resonance signals from the sub-volumes by performing 3D encoding on each of the excited sub-volumes; and
a data processor configured to reconstruct the acquired magnetic resonance signals into image data corresponding to each of the sub-volumes using a parallel imaging algorithm that uses phase information of the RF pulses and channel information of multi-channel receiving coils used to acquire the magnetic resonance signals, the channel information comprising a sensitivity profile with respect to each coil included in the multi-channel receiving coils.

12. The MRI system of claim 11, wherein the groups comprise a first group through an N-th group, where N is a natural number that is equal to or greater than two; and
the MRI scanner is further configured to sequentially and iteratively assign the sub-volumes to one of the first to N-th groups.

13. The MRI system of claim 11, wherein the MRI scanner comprises gradient coils configured to apply to the target volume a first encoding gradient with respect to a first direction and a second encoding gradient with respect to a second direction to perform the 3D encoding on each of the excited sub-volumes, where either the first direction or the second direction is the same as a direction in which the selection gradient is applied.

14. The MRI system of claim 11, wherein the MRI scanner comprises:
gradient coils configured to apply a read-out gradient to the target volume to read out magnetic resonance signals from the sub-volumes, and
the data processor comprises a reconstruction part configured to reconstruct the magnetic resonance signals acquired from the multi-channel receiving coils into the image data corresponding to each of the sub-volumes.

15. The MRI system of claim 11, wherein the data processor comprises a synthesis part configured to:
reconstruct the acquired magnetic resonance signals into the image data corresponding to each of the sub-volumes included in each group; and
synthesize the reconstructed image data.

16. A magnetic resonance imaging (MRI) method, the MRI method comprising:
sequentially dividing a target volume into sub-volumes along a directional axis;
grouping the sub-volumes into groups constituting the target volume, wherein adjacent sub-volumes belong to different groups;
applying radio frequency (RF) pulses, each comprising a frequency component and each having a different phase, and a selection gradient separately to each group to simultaneously excite sub-volumes in each group;
performing 3D encoding on each of the excited sub-volumes;
acquiring magnetic resonance signals from the 3D encoded sub-volumes; and
reconstructing the acquired magnetic resonance signals into image data corresponding to each of the sub-volumes using a parallel imaging algorithm that uses phase information of the RF pulses and channel information of multi-channel receiving coils used to acquire the magnetic resonance signals, the channel information comprising a sensitivity profile with respect to each coil included in the multi-channel receiving coils.

17. The MRI method of claim 16, further comprising synthesizing the image data corresponding to each of the sub-volumes to generate a 3D volume image.

18. The MRI method of claim 16, wherein the performing of the 3D encoding on each of the excited sub-volumes comprises applying a first encoding gradient with respect to a first direction and a second encoding gradient with respect to a second direction to each of the excited sub-volumes, where the second direction is the same as the directional axis.

19. A magnetic resonance imaging (MRI) system comprising:
an MRI scanner configured to:
sequentially divide a target volume into sub-volumes along a directional axis;
group the sub-volumes into groups constituting the target volume, wherein adjacent sub-volumes belong to different groups;
apply radio frequency (RF) pulses, each comprising a frequency component and each having a different phase, and a selection gradient separately to each group to simultaneously excite sub-volumes in a group;
perform 3D encoding on each of the excited sub-volumes; and
acquire magnetic resonance signals from the 3D encoded sub-volumes; and
an MRI processor configured to reconstruct the acquired magnetic resonance signals into image data corresponding to each of the sub-volumes using a parallel imaging algorithm that uses phase information of the RF pulses and channel information of multi-channel receiving coils used to acquire the magnetic resonance signals, the channel information comprising a sensitivity profile with respect to each coil included in the multi-channel receiving coils.

20. The MRI system of claim 19, wherein the MRI processor is further configured to synthesize the image data corresponding to each of the sub-volumes to generate a 3D volume image.

21. The MRI system of claim 19, wherein the MRI scanner is further configured to apply a first encoding gradient with respect to a first direction and a second encoding gradient with respect to a second direction to each of the excited sub-volumes, where the second direction is the same as the directional axis.

22. The MRI method of claim 1, wherein the parallel imaging algorithm uses a coil field map based on the sensitivity profile with respect to each coil included in the multi-channel receiving coils and the phase information of the RF pulses.

23. The MRI method of claim 22, wherein the coil field map is a matrix obtained by taking the product of R, denoting a matrix comprising the phase information of the RF pulses, and b, denoting the sensitivity profile with respect to each coil included in the multi-channel RF receiving coils.

24. The MRI method of claim 23, wherein the reconstructing uses the following equation to reconstruct the magnetic resonance signals:

$$F=(B^T \cdot B)^{-1} \cdot B^T \cdot S,$$

wherein the superscript T in a matrix denotes a transpose matrix with respect to the matrix, B denotes the coil field map, F denotes a signal indicating reconstructed image data with respect to the sub-volumes included in the first group, and S denotes a signal received from the multi-channel receiving coils.

* * * * *